(12) United States Patent
Hollingsworth et al.

(10) Patent No.: US 6,318,622 B1
(45) Date of Patent: Nov. 20, 2001

(54) HIGH POWER HYBRID MODULES ASSEMBLY USING VACUUM OVEN FOR PERMANENT ELECTRICAL CONNECTIONS

(75) Inventors: Gregg A. Hollingsworth, Milpitas; Joseph Herbert Johnson, Sunnyvale, both of CA (US)

(73) Assignee: Xemod, Inc., Sunnyvale, CA (US)

( * ) Notice: Subject to any disclaimer, the term of this patent is extended or adjusted under 35 U.S.C. 154(b) by 0 days.

(21) Appl. No.: 09/567,422

(22) Filed: May 9, 2000

Related U.S. Application Data

(60) Continuation of application No. 09/200,329, filed on Nov. 25, 1998, now abandoned, which is a division of application No. 08/814,420, filed on Mar. 11, 1997, now abandoned.

(51) Int. Cl.⁷ .................................................. B23K 37/04
(52) U.S. Cl. ............................. 228/4.5; 228/46; 228/49.5
(58) Field of Search .................................. 228/4.5, 110.1, 228/46, 49.5; 29/840, 740, 743; 257/710, 712

(56) References Cited

U.S. PATENT DOCUMENTS

| | | | |
|---|---|---|---|
| 4,881,320 | * | 11/1989 | Kohle et al. .. |
| 5,252,053 | * | 10/1993 | Schraven et al. .. |
| 5,418,688 | * | 5/1995 | Hertz et al. .. |
| 5,635,115 | * | 6/1997 | Konishi et al. .. |
| 5,659,947 | * | 8/1997 | Eilers et al. .. |
| 5,663,106 | * | 9/1997 | Karavakis et al. .. |
| 6,232,151 | * | 5/2001 | Ozmat et al. .. |

* cited by examiner

Primary Examiner—M. Alexandra Elve
Assistant Examiner—Jonathan Johnson
(74) Attorney, Agent, or Firm—Boris G. Tankhilevich

(57) ABSTRACT

The apparatus for assembly of high power hybrid modules including high power semiconductor chips and conventional surface mount technology (SMT) components are disclosed. The vacuum oven is used for creating the permanent electrical connection between each high power semiconductor chip and the high power hybrid module. The soldering reflow process is used to attach each SMT component to the high power hybrid module. The automated high power hybrid modules assembling process yields the high power hybrid modules with excellent thermal properties.

6 Claims, 4 Drawing Sheets

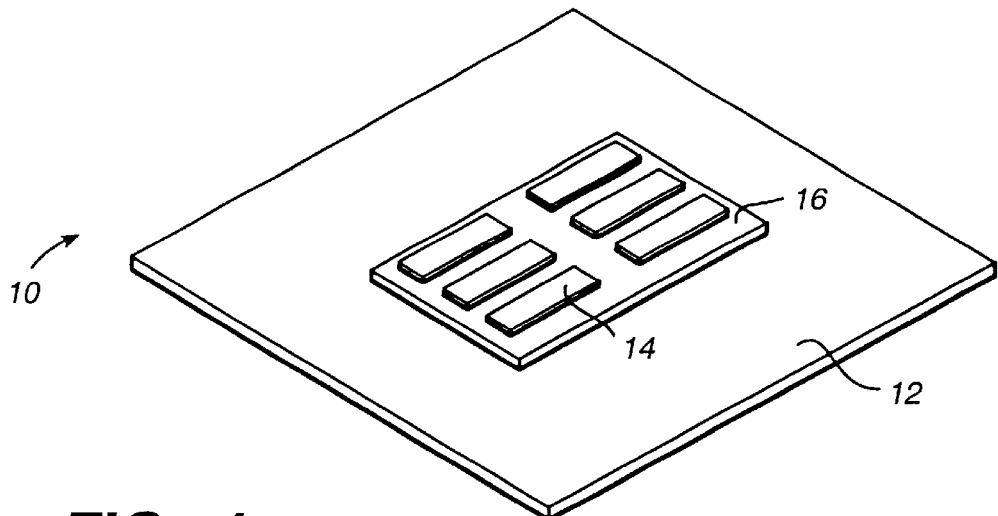
FIG._1
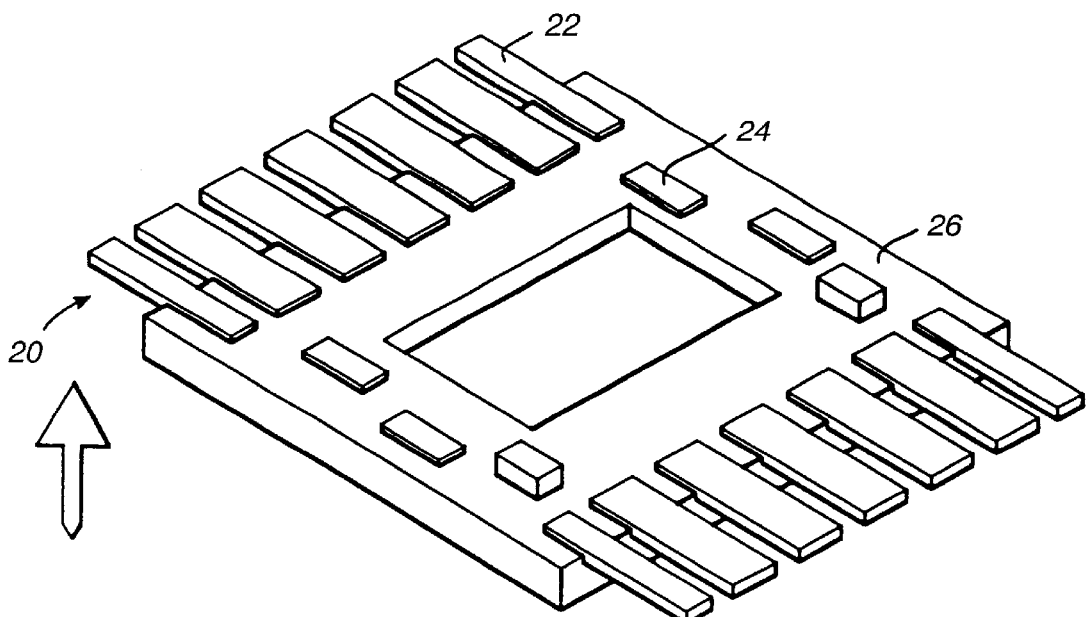
FIG._2

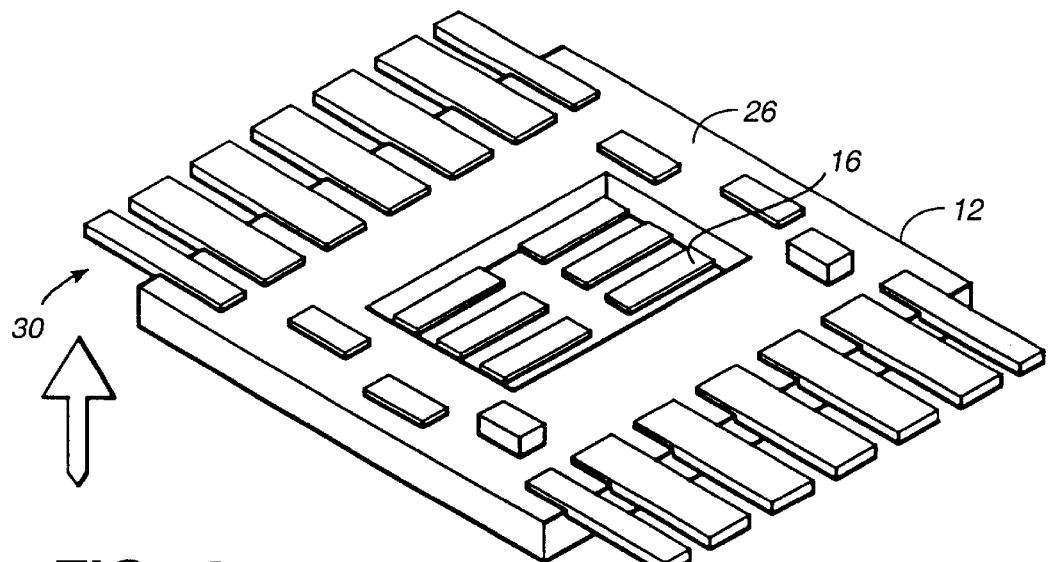
FIG._3
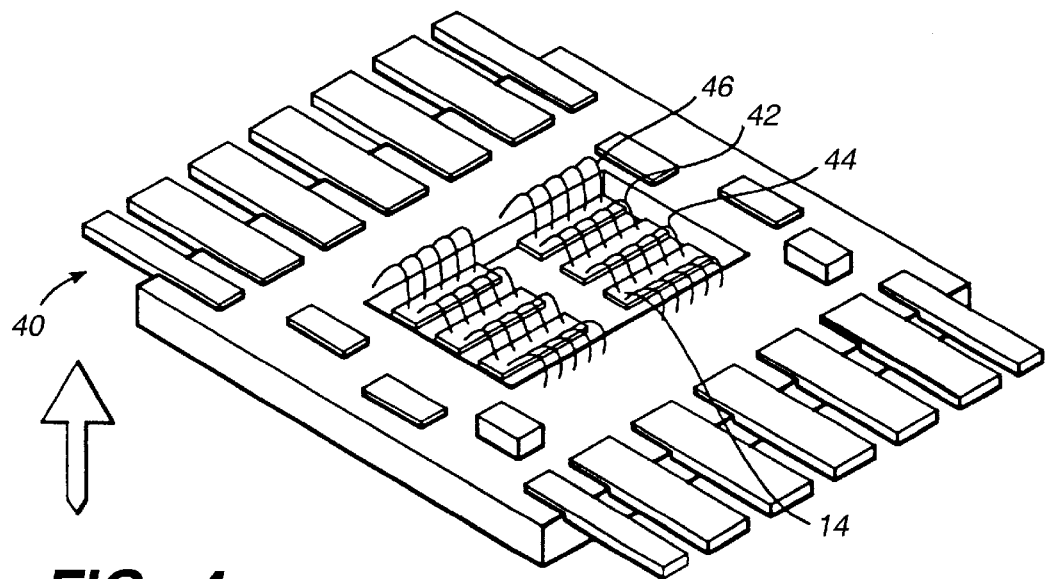
FIG._4

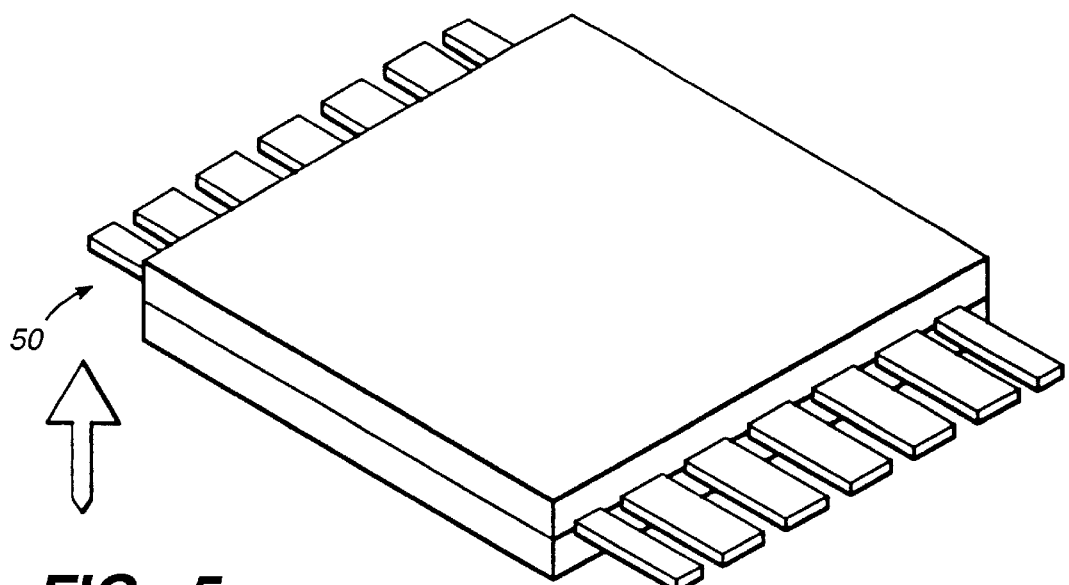
FIG._5
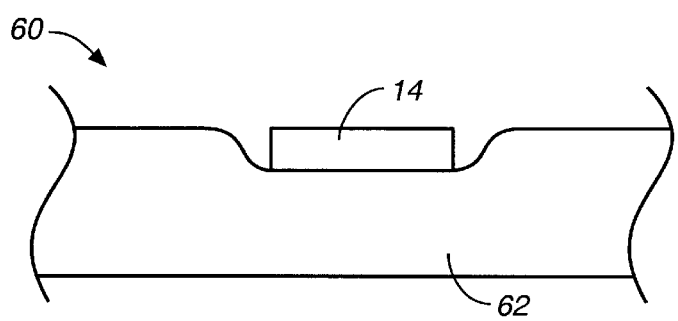
FIG._6
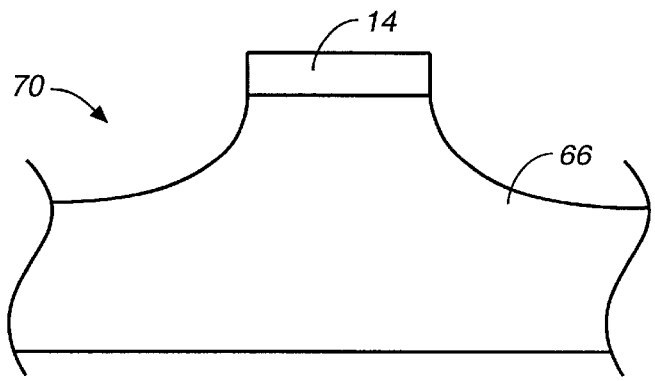
FIG. 7

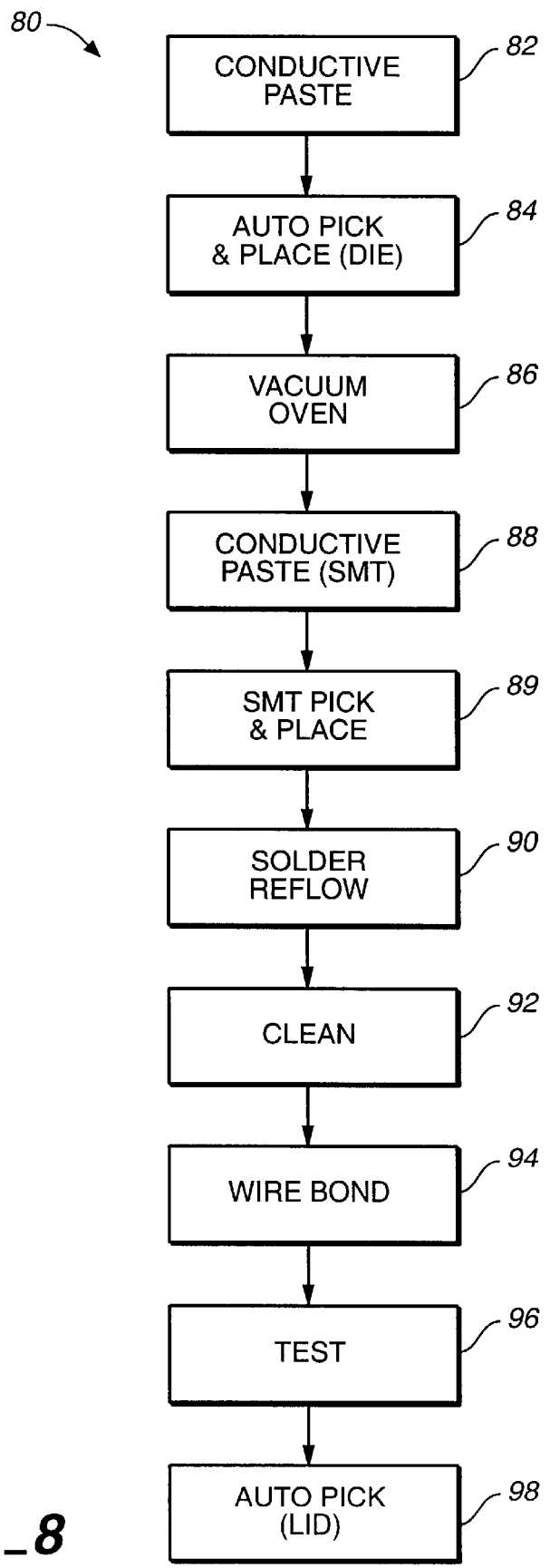
FIG._8

HIGH POWER HYBRID MODULES ASSEMBLY USING VACUUM OVEN FOR PERMANENT ELECTRICAL CONNECTIONS

This is a continuation application for the U.S. Patent application entitled "METHOD AND APPARATUS FOR POWER MODULE ASSEMBLY THAT USES VACUUM DIE ATTACHMENT", Ser. No. 09/200,329, filed on Nov. 25, 1998 now abandoned, that is a divisional application for the U.S. Patent application entitled "HYBRID MODULE ASSEMBLING METHOD AND APPARATUS", Ser. No. 08/814,420, filed on Mar. 11, 1997 now abandoned.

FIELD OF THE INVENTION

The present invention relates generally to the field of hybrid module assembling, and more specifically, to the field of high power hybrid module assembling.

DESCRIPTION OF THE BACKGROUND ART

In one prior art related to hybrid module assembling, a hybrid module usually included a plurality of semiconductor chips and a plurality of Surface Mount Technology components (SMT) including resistors, conductors, inductors and other SMT components. The prior art process of manufacturing a hybrid module included the process of mounting semiconductor chips or packaged devices and SMT components on a ceramic substrate.

There are several prior art machines that do automatic die attachment for high power semiconductors. These machines utilize the standard process of scrubbing the die in a figure eight pattern to eliminate any voids under the die. The die is attached using an eutectic solder. However, the usage of these machines is a very expensive and a time consuming procedure because the die is attached to each chip at one chip at the time.

What is needed is a high power hybrid module assembling apparatus that utilizes a more time efficient and less expensive die attachment procedure.

SUMMARY OF THE INVENTION

To address the shortcomings of the available art, the present invention discloses an apparatus for a time efficient high power hybrid module assembling.

In the preferred embodiment of the present invention, the high power hybrid module assembling apparatus comprises: (a) a high power semiconductor chip pick-and-place machine configured to provide a first plurality of high power semiconductor chips; (b) a high power semiconductor chip conductive-paste. placement machine configured to provide a first conductive layer for the first plurality of high power semiconductor chips; (c) a vacuum oven configured to create a permanent electrical connection between each high power semiconductor chip and a first substrate by heating the first conductive layer in vacuum; (d) a Surface Mount Technology (SMT) pick-and-place machine configured to provide a second plurality of SMT components; (e) an SMT conductive-paste-placement machine configured to provide a second conductive layer for the second plurality of SMT components; (f) a reflow soldering machine configured to solder each SMT component to a second substrate by using the second conductive layer, wherein the second substrate includes a plurality of conductive patterns; (g) a cleaning device; (h) an automatic wire bonding machine configured to wire-bond each high power semiconductor chip to the high power hybrid module; (i) a testing machine configured to test each high power hybrid module; and (k) a lid-placement machine configured to place a lid on each tested high power hybrid module. The usage of the vacuum oven allows to process a rack of high power hybrid modules at the same time thus significantly increasing the time efficiency of the high power hybrid module assembling process.

In one embodiment of the present invention, the high power semiconductor chip conductive-paste-placement machine further comprises a stencil printer configured to put solder paste onto the first substrate in precise locations through holes in a screen, and the SMT component conductive-paste-placement machine further comprises a stencil printer configured to put solder paste onto the second substrate in precise locations through holes in the screen.

In one embodiment of the present invention, the automatic wire bonding machine further includes an ultrasonic wedge-wedge automatic wire bonding machine. In an alternative embodiment of the present invention, the automatic wire bonding machine further includes a thermosonic ball & wedge automatic wire bonding machine.

BRIEF DESCRIPTION OF THE DRAWINGS.

The aforementioned advantages of the present invention as well as additional advantages thereof will be more clearly understood hereinafter as a result of a detailed description of a preferred embodiment of the invention when taken in conjunction with the following drawings.

FIG. 1 depicts a plurality of high power semiconductor chips attached to the first substrate bonded to the base plate.

FIG. 2 shows the second substrate including SMT components and leads attached.

FIG. 3 illustrates the second substrate bonded to the first substrate.

FIG. 4 is a depiction of wire bonded high power semiconductor chips in the high power hybrid module.

FIG. 5 shows a fully assembled high power hybrid module with lid attached.

FIG. 6 illustrates how the first substrate is preformatted using dimples to indicate a plurality of predetermined locations for each high power semiconductor chip.

FIG. 7 shows how the first substrate is preformatted using pedestals to indicate a plurality of predetermined locations for each high power semiconductor chip.

FIG. 8 depicts a system for high power hybrid module assembly.

DETAILED DESCRIPTION OF THE PREFERRED AND ALTERNATIVE EMBODIMENTS

There are two problems associated with building of a prior art hybrid module. At first, the prior art die attachment operation requires that each semiconductor chip be dye-attached one at the time because the dye-attachment machine has to scrub the die into eutectic melt or some other kind of attachment material like epoxy. Secondly, even though the dye-attachment machine would scrub one chip at the time, with a lengthier chip the dye-attachment machine would have a voiding problem because all air pockets cannot be removed beneath the chip.

Those prior art problems are only exacerbated in assembling of high power hybrid modules. Indeed, the density of heat flow from a high power hybrid chip module is higher than the density of heat flow from a standard prior art hybrid module. Thus, even a single air pocket creates an insulation area that causes unacceptable localized heat over this air pocket that can significantly damage or even destroy the high power hybrid chip. In the prior art standard hybrid chip module the heat flow is not high enough to cause this kind of problem.

The present invention deals with both prior art problems by using a vacuum oven in order to create a permanent electrical connection between each high power semiconductor chip and a first substrate by heating the first conductive layer in vacuum. Indeed, the usage of vacuum oven facilitates the batch process so that a rack of high power hybrid modules can be placed in the vacuum oven at the same time. The voiding problem is also solved because the vacuum oven sucks out all air from the air pockets located beneath the high power hybrid chip. (Please, see the full description below).

As shown in FIG. 1, the high power hybrid module (10) is a piece of circuitry that includes a plurality of high power semiconductor chips (14) mounted on a first substrate (16).

In the preferred embodiment of the present invention, the first substrate (16) is attached to a base plate (12) designed to conduct heat away from each high power semiconductor chip to a heat sink (not shown) because each high power semiconductor chip generates a lot of heat energy during its operation. The heatsink (not shown) can include a simple mounting plate or a more complex structure for the dissipation of heat. For instance, a plurality of fins in aluminum extrusion can comprise a heatsink.

Referring FIG. 2, the high power hybrid module (20) also includes a plurality of Surface Mount Technology (SMT) components, like resistors and capacitors (24), and a plurality of leads (22) mounted to a second substrate (26). The first substrate (16) and the base plate (12) are bonded to the second substrate (26), as shown in FIG. 3.

As shown in FIG. 4, each high power semiconductor chip (42) is wire bonded to its neighboring high power semiconductor chip (44 and 46). The first substrate and the base plate can be put into a fixture and molded together to create a molded plastic package (50 of FIG. 5).

As shown in FIG. 8, the present invention includes an apparatus (80) for high power hybrid module assembling. In the preferred embodiment, the apparatus (80) includes a conductive-paste-placement machine (82) configured to provide a conductive layer for high power semiconductor chips. The pick-and-place machine (84) is configured to provide a plurality of high power semiconductor chips, wherein the vacuum oven (86) is configured to create a permanent electrical connection between each high power semiconductor chip and a baseplate. The vacuum oven (86) performs a heating cycle in vacuum in order to create a permanent electrical connection between each high power semiconductor chip and a first substrate. The usage of the vacuum oven facilitates the assembling process because the rack of high power hybrid modules can be placed in the vacuum oven (86) at the same time. Additionally, the usage of the vacuum oven eliminates the voiding problem because the vacuum oven sucks out all air from the air pockets located beneath each high power hybrid chip.

Referring still to FIG. 8, the apparatus (80) for high power hybrid module assembling additionally comprises a conductive-paste-placement machine (88) configured to provide a conductive layer for SMT components, a pick-and-place machine (89) configured to provide a plurality of SMT components, and a reflow soldering machine (90) configured to solder each SMT component to a substrate. After the soldering procedure of SMT components is completed, a solder cleaning machine (92) is configured to clean each high power hybrid module. An automatic wire bonding machine (94) wire bonds each high power semiconductor chip to the first substrate, and a testing machine (96) tests each high power hybrid module. Finally, a lid placement machine (98) is configured to place a lid on each tested and assembled high power hybrid module.

In an alternative embodiment, the present invention includes an apparatus (80) for high power hybrid module including: (a) the conductive-paste-placement machine (82) configured to provide a conductive layer for high power semiconductor chips; (b) the pick-and-place machine (84) configured to provide a plurality of high power semiconductor chips; (c) the vacuum oven (86) configured to create a permanent electrical connection between each high power semiconductor chip and a baseplate; (d) the conductive-paste-placement machine (88) configured to provide a conductive layer for SMT components; (e) the pick-and-place machine (89) configured to provide a plurality of SMT components; (f) the reflow soldering machine (90) configured to solder each SMT component to a substrate; (g) the automatic wire bonding machine (94) configured to wire bond each high power semiconductor chip to the first substrate; and (h) the lid placement machine (98) configured to place a lid on each tested and assembled high power hybrid module.

In order to manufacture a high power hybrid chip using the apparatus of the present invention (80 of FIG. 8), a number of procedures has to be completed. The first substrate (16 of FIG. 1) should be prepared. The first substrate can include: an alumina, a teflon glass, a sapphire, a diamond, a copper molybdenum copper, a tungsten copper alloy, a beryllium oxide (BeO), or a copper first substrate. The first substrate provides the thermal path for heat dissipated from semiconductor elements.

Next, in order to mount high power semiconductor chips on the first substrate, the first substrate should be nickel plated in order to improve its solderability, and preformatted to indicate a plurality of predetermined locations for each high power semiconductor chip. As shown in FIG. 6, the dimples (62) can be used to indicate the predetermined location for each high power semiconductor chip. As shown in FIG. 7, the pedestals (66) can be used for the same purpose.

Once the first substrate is ready, it is covered with a first conductive layer by using a conductive-paste-placement machine (82 of FIG. 8). In one embodiment, the conductive-paste-placement machine can include a stencil printer configured to put solder paste onto a substrate in precise locations through holes in the screen. In the alternative embodiment, the solder preform or paste can be introduced on top of the pedestal or dimple to be directly underneath the chip that is about to be attached.

Next, each passive or active high power semiconductor chip is placed precisely placed at preformatted predetermined location on the first substrate by using an auto pick-and-place die machine (84 of FIG. 8). The auto pick-and-place die machine model 3AV manufactured by Contact, Inc., Danbury, Conn., can be used for the purposes of the present invention.

The first substrate with high power semiconductor chips located in the predetermined positions is placed into a vacuum furnace (86 of FIG. 8). The soldering process is implemented in the vacuum furnace in order to permanently attach each high power semiconductor chip to the first substrate. The vacuum furnace used in the present invention can be implemented by utilizing the enhanced vacuum process furnace MV-2200 manufactured by Scientific Sealing Technology, Inc, in Downey, Conn. This furnace is configured for hermetically sealing components in vacuum, low moisture environment. During the heating process in such vacuum furnace, all of the residual air is effectively sucked out from each high power semiconductor chip. In an alternative embodiment, the oven can include a vacuum reflow oven.

A plurality of conductor patterns is usually formed on the surface of the first substrate. It can be done by metallizing the first substrate, covering it with photo-resistive material and defining the required conductor pattern (by using a photographic process, or direct mask, or ion beam, or electron beam). The photoresistive layer is processed using the acids.

The reflow soldering method is used for soldering the leads of the high power semiconductor chips to the plurality of conductor patterns of the first substrate (16) in the vacuum furnace. The reflow soldering is the predominant soldering method for surface mount technology assemblies. The reflow soldering technique provides an opportunity to handle assemblies with components on both sides, some with surface mount mixed with conventional through-hole components. The reflow soldering is a fixed mass-soldering operation. Several methods exist to effectively reflow solder paste. The two major mass reflow methods use the vapor phase condensation and infrared radiation for heating. For the full reference see the "Step 6, Reflow Soldering" by Charles L. Hutchins in the Surface Mount Technology (SMT) magazine in 1994. This article is incorporated by reference herein.

Each high power semiconductor chip has at least three electrical connectors: a common lead, an input lead and an output lead. Each semiconductor device can include a passive device, or an active device. For example, a field effect high power semiconductor chip device can be configured to comprise a capacitor, that is a passive device. On the other hand, the same field effect high power semiconductor chip device can be configured to comprise an active semiconductor device.

In the field effect device technology, the common leads of each high power semiconductor chip are conductively connected to a plurality of conductor patterns on the topside of the first substrate (not shown). In the bipolar technology, the output leads are conductively connected to the topside of the first substrate (not shown). In the LDMOS technology, all three leads are connected to the top side of the first substrate (not shown).

The first substrate (16 of FIG. 1) is attached to a base plate (12) using as a bonding agent a solder, an adhesive, a conductive silver loaded silicon adhesive, or an epoxy resin. The base plate can comprise: a metal, a ceramic, an alumina, a beryllium oxide (BeO), a glass, a printed circuit board material, a teflon glass, a sapphire, a copper molybdenum copper, a tungsten copper alloy base plate, a copper, or a diamond.

As was mentioned above, the base plate is designed to conduct heat away from each high power semiconductor chip to a heat sink (not shown) because each high power semiconductor chip generates a lot of heat energy during its operation. The heatsink (not shown) can include a simple mounting plate or a more complex structure for the dissipation of heat. For instance, a plurality of fins in aluminum extrusion can comprise a heatsink.

Next, the first substrate (16) and the base plate (12) are bonded to the second substrate (26). This can be done by using as a bonding agent a solder, an adhesive, a conductive silver loaded silicon adhesive, or an epoxy resin. The second substrate can comprise: a ceramic, an alumina, a beryllium oxide (BeO), a glass, a printed circuit board material, a teflon glass, a sapphire, or a molded plastic second substrate. The second substrate (26 of FIG. 2) is covered with a second conductive layer by using a SMT conductive-paste-placement machine (88 of FIG. 8). The second substrate (26) also includes a plurality of conductor patterns on its topside. The solder reflow process can be utilized to physically attach each SMT component and each lead to a plurality of conductor patterns on the top of the second substrate.

Next, a plurality of surface mount technology (SMT) components (24) and a plurality of leads (22) is mounted to a second substrate (26) by using a SMT pick-and-place machine (89 of FIG. 8). The leads (22) can be used to input a highfrequency current to the high power hybrid module in order to operate the high power hybrid module. The assembly of the SMT components can be performed independently from (and before than) the assembly of the high power semiconductor chips described above. Each lead can be placed simultaneously in one move on the second substrate using a leadframe.

Next, each SMT component is soldered to the plurality of conductive patterns on the second substrate by using a reflow soldering machine (90 of FIG. 8) (see discussion above). In the preferred embodiment, each high power hybrid module is cleaned by using a solder cleaning device (92 of FIG. 8).

Next, each high power semiconductor chip is wire-bonded to the neighboring chip by using an automatic wire bonding machine (94 of FIG. 8). As shown in FIG. 4, each high power semiconductor chip can be wire bonded to its neighboring high power semiconductor chip. In one embodiment, the input and output leads of each high power semiconductor chip are wire bonded to input and output leads of the neighboring chips. In another embodiment, the input and common leads of each chip are wire bonded to the input and common leads of the neighboring chips. Yet, in one more embodiment, the input, output, and common leads of each chip are wire bonded to the input, output, and common leads of the neighboring chips. The chips that are close to the border of the high power hybrid module are wire bonded to the conductive pattern of the second substrate.

The chip leads can be thermosonically, ultrasonically, or using thermal compression wire bonded to the leads of other chips or to the conductive pattern of the first substrate. This operation can be performed using a model 2400 West-bond ultrasonic wedge-wedge wire bonder or a model 2700B West-Bond thermosonic ball & wedge automatic wire bonder manufactured by West-Bond, Inc, Anaheim, Calif.

In the preferred embodiment, the electrical integrity of each high power hybrid module is tested by using a testing machine (96 of FIG. 8). If the test results are normal, a plastic lid (50 of FIG. 5) is attached to each high power hybrid module using an adhesive preform. The preform can include a piece of epoxy resin that has its shape presized to fit into the high power hybrid module. This operation can be done by using an autopick lid machine (98 of FIG. 8). It is believed that a person reasonably skillful in the art can easily implement a lid-placement machine to permanently attach a plastic lid to a tested high power hybrid module. In one embodiment, the lid placement machine can be implemented using a combination of a pick-and-place machine and a furnace. See description above.

In one embodiment of the present invention, one can put the first substrate and the base plate into a fixture and mold the first substrate and the base plate together to create a molded plastic package that is used as a second substrate. In this embodiment, the method of high power hybrid module assembling comprises the following steps: (a) mounting a plurality of high power semiconductor chips to a first substrate; (b) attaching the first substrate to a base plate; (c) putting the first substrate and the base plate into a fixture and molding the first substrate and the base plate together to create a molded plastic package that is used as a second substrate; (d) mounting a plurality of surface mount technology (SMT) components and mounting a plurality of leads to the second substrate; and (e) automatic wire bonding each high power semiconductor chip to the first substrate to achieve the electrical connection between each high power semiconductor chip and the high power hybrid module.

Yet, in one additional embodiment, a base plate can include a first substrate. In this embodiment, the disclosed method has the following steps: (a) mounting a plurality of high power semiconductor chips to a base plate; (b) mounting a plurality of surface mount technology (SMT) components and mounting a plurality of leads to a substrate; (c) bonding the base plate to the substrate; and (d) automatic wire bonding each high power semiconductor chip to the first substrate to achieve the electrical connection between each high power semiconductor chip and the high power hybrid module.

The description of the preferred embodiment of this invention is given for purposes of explaining the principles thereof, and is not to be considered as limiting or restricting the invention since many modifications may be made by the exercise of skill in the art without departing from the scope of the invention.

What is claimed is:

1. An apparatus for a high power hybrid module assembling comprising:

a high power semiconductor chip pick-and-place machine configured to provide a first plurality of high power semiconductor chips;

a high power semiconductor chip conductive-paste-placement machine configured to provide a first conductive layer for said first plurality of high power semiconductor chips;

a vacuum oven configured to create a permanent electrical connection between each said high power semiconductor chip and a first substrate by heating said first conductive layer in vacuum;

a Surface Mount Technology (SMT) pick-and-place machine configured to provide a second plurality of SMT components;

an SMT conductive-paste-placement machine configured to provide a second conductive layer for said second plurality of SMT components;

a reflow soldering machine configured to solder each said SMT component to a second substrate by using said second conductive layer; said second substrate including a plurality of conductive patterns;

a cleaning device;

an automatic wire bonding machine configured to wire-bond each said high power semiconductor chip to said high power hybrid module;

a testing machine configured to test each said high power hybrid module; and a lid-placement machine configured to place a lid on each said tested high power hybrid module;

wherein said vacuum oven is configured to eliminate a plurality of air pockets located beneath each said high power semiconductor chip;

and wherein said vacuum oven is configured to facilitate a batch process by placing a rack of said high power hybrid modules in said vacuum oven at the same time.

2. The apparatus of claim 1, wherein said high power semiconductor chip conductive-paste-placement machine further comprises:

a stencil printer configured to put solder paste onto said first substrate in precise locations through holes in a screen.

3. The apparatus of claim 1, wherein said SMT component conductive-paste-placement machine further comprises:

a stencil printer configured to put solder paste onto said second substrate in precise locations through holes in a screen.

4. The apparatus of claim 1, wherein said automatic wire bonding machine further includes:

an ultrasonic wedge-wedge automatic wire bonding machine.

5. The apparatus of claim 1, wherein said automatic wire bonding machine further includes:

a thermosonic ball & wedge automatic wire bonding machine.

6. An apparatus for a high power hybrid module assembling comprising:

a high power semiconductor chip pick-and-place machine configured to provide a first plurality of high power semiconductor chips;

a high power semiconductor chip conductive-paste-placement machine configured to provide a first conductive layer for said first plurality of high power semiconductor chips;

a vacuum oven configured to create a permanent electrical connection between each said high power semiconductor chip and a first substrate by heating said first conductive layer in vacuum;

a Surface Mount Technology (SMT) pick-and-place machine configured to provide a second plurality of SMT components;

an SMT conductive-paste-placement machine configured to provide a second conductive layer for said second plurality of SMT components;

a reflow soldering machine configured to solder each said SMT component to a second substrate by using said second conductive layer; said second substrate including a plurality of conductive patterns;

an automatic wire bonding machine configured to wire-bond each said high power semiconductor chip to said high power hybrid module; and a lid-placement machine configured to place a lid on each said tested high power hybrid module;

wherein said vacuum oven is configured to eliminate a plurality of air pockets located beneath each said high power semiconductor chip;

and wherein said vacuum oven is configured to facilitate a batch process by placing a rack of said high power hybrid modules in said vacuum oven at the same time.

* * * * *